United States Patent
Fan et al.

(10) Patent No.: US 10,700,688 B1
(45) Date of Patent: Jun. 30, 2020

(54) LOW POWER AND LOW JITTER PHASE LOCKED LOOP WITH DIGITAL LEAKAGE COMPENSATION

(71) Applicant: Intel Corporation, Santa Clara, CA (US)

(72) Inventors: Yongping Fan, Portland, OR (US); Dan Zhang, Hillsboro, OR (US); Bo Xiang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/221,388

(22) Filed: Dec. 14, 2018

(51) Int. Cl.
| | |
|---|---|
| *G04F 10/00* | (2006.01) |
| *H03L 7/089* | (2006.01) |
| *H03L 7/099* | (2006.01) |
| *H03L 7/18* | (2006.01) |
| *H03L 7/093* | (2006.01) |

(52) U.S. Cl.
CPC ............ *H03L 7/0893* (2013.01); *H03L 7/093* (2013.01); *H03L 7/099* (2013.01); *H03L 7/18* (2013.01); *G04F 10/005* (2013.01)

(58) Field of Classification Search
USPC .................................. 327/157, 159; 331/16
See application file for complete search history.

(56) References Cited

U.S. PATENT DOCUMENTS

| | | | | |
|---|---|---|---|---|
| 9,252,788 | B1 * | 2/2016 | Stanton | .................... H03K 5/24 |
| 9,634,678 | B1 | 4/2017 | Caffee et al. | |
| 2005/0168292 | A1 * | 8/2005 | Frans | .................... H03L 7/0812 331/16 |
| 2007/0188243 | A1 * | 8/2007 | Waheed | .................... H03C 5/00 331/16 |
| 2009/0153253 | A1 | 6/2009 | Mei | |
| 2010/0141491 | A1 * | 6/2010 | Caplan | ................... H03L 7/0895 341/118 |
| 2010/0264993 | A1 * | 10/2010 | Wang | ..................... H03L 7/087 331/1 A |
| 2012/0038426 | A1 | 2/2012 | Tamura et al. | |
| 2013/0021193 | A1 * | 1/2013 | Hermsen | ............... G01S 5/0273 342/51 |
| 2013/0229213 | A1 * | 9/2013 | Park | ....................... H03L 7/0891 327/157 |
| 2015/0145570 | A1 | 5/2015 | Perrott | |

(Continued)

OTHER PUBLICATIONS

Byun, Sangjin et al., "Charge Pump circuit with wide range digital leakage current mismatch compensator", IEEE Electronics Express, vol. 7, No. 23, 5 pgs.

(Continued)

*Primary Examiner* — Eva Y Puente
(74) *Attorney, Agent, or Firm* — Green, Howard & Mughal LLP

(57) ABSTRACT

Described is a low power and low jitter phase locked loop (PLL) or delay locked loop (DLL) with digital leakage compensation. The compensation is provided by an apparatus which comprises: a circuitry to generate a pulse with a digitally controlled pulse width, wherein the pulse width is proportional to a static phase error of a PLL or a DLL; and a charge pump coupled to the circuitry, wherein the charge pump is to receive the pulse and to source or sink current to or from a node according to the pulse width.

18 Claims, 12 Drawing Sheets

(56) References Cited

U.S. PATENT DOCUMENTS

2015/0145571 A1* 5/2015 Perrott .................... H03L 7/093
                                                      327/159
2017/0207807 A1* 7/2017 Lee ...................... H03B 5/1215
2018/0191360 A1* 7/2018 Groe .................... H03B 5/1212
2018/0212611 A1   7/2018 Shen et al.

OTHER PUBLICATIONS

Kim, Kyung K. et al., "A 32nm and 0.9V CMOS Phase-Locked Loop with Leakage Current and Power Supply Noise Compensation", Journal of Semiconductor Technology and Science, vol. 7, No. 1, Mar. 2007, 9 pgs.

Kim, Kyung K. et al., "Phase-Locked Loop with Leakage and Power/Ground Noise Compensation in 32nm Technology", Journal of Semiconductor Technology and Science, vol. 7, No. 4, Dec. 2007, 6 pgs.

International Search Report and Written Opinion from PST/US2019/061023 dated Apr. 9, 2020, 12 pgs.

* cited by examiner

LOW POWER AND LOW JITTER PHASE LOCKED LOOP WITH DIGITAL LEAKAGE COMPENSATION

BACKGROUND

Compared to a digital phase locked loop (PLL), an analog PLL has the advantages of lower power consumption (e.g., approximately four times lower power consumption than a digital PLL), lower jitter (e.g., 3 to 5 times better than digital PLL), and lower cost in design, which are desired by low power devices such as server, client machines, system-on-chip (SOC), and wearable computing devices. As the push for low power, low jitter, and low area PLL design continues in 10 nm process node and beyond, the leakage from various sources could become an issue in the applications where the reference clock frequency is low and the static phase error is required to be close to zero at all process corners and temperatures. One effect of these leakage currents on analog PLLs is the increase of static phase error and reference spur. For PLLs with low reference clock frequency (e.g., large multiplication factor N), where the leakage current accumulates longer time (e.g., for a duration of a reference clock period), the control voltage Vctl of a voltage controlled oscillator (VCO) can drift higher or lower depending on the leakage current direction.

The background description provided herein is for the purpose of generally presenting the context of the disclosure. Unless otherwise indicated herein, the materials described in this section are not prior art to the claims in this application and are not admitted to be prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
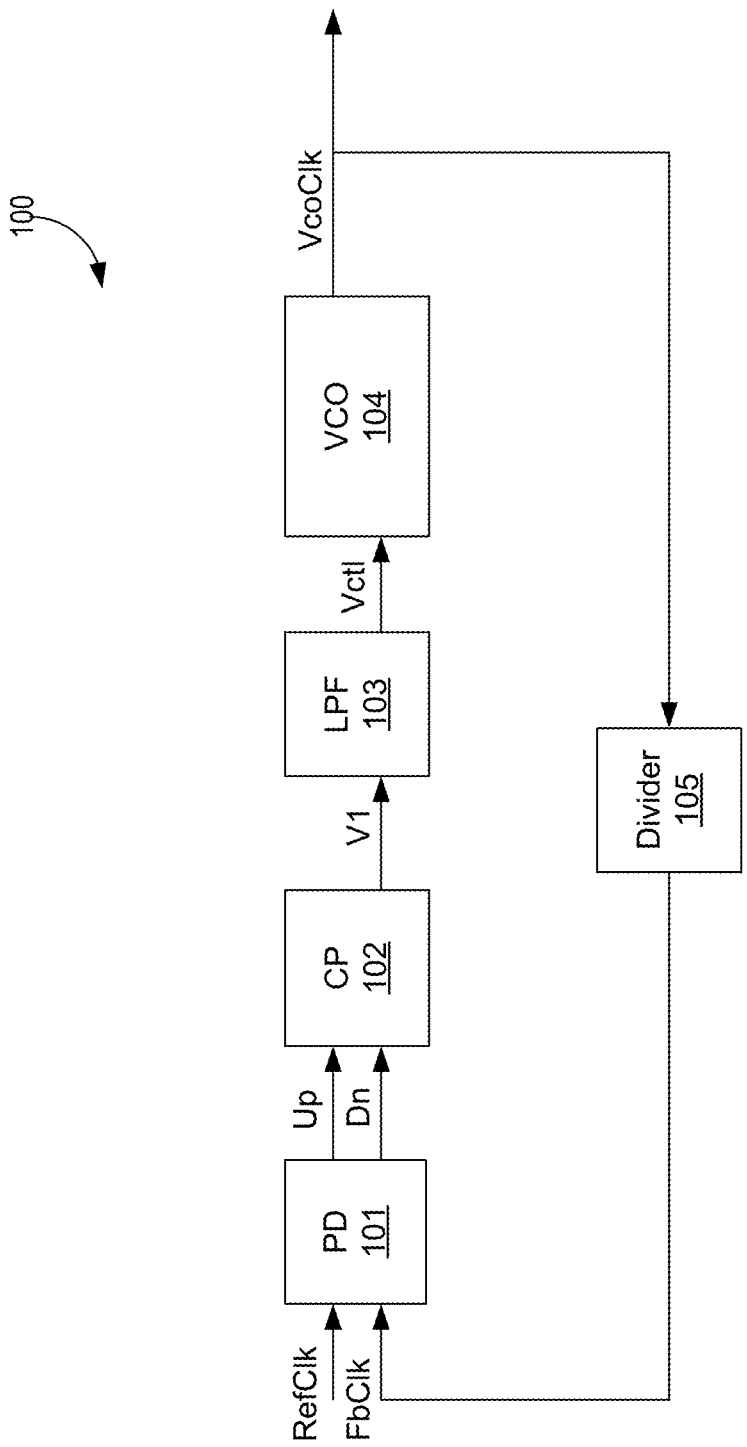
FIG. 1 illustrates a phase locked loop (PLL) where leakage current in the charge pump causes phase error and drift to control voltage of the oscillator of the PLL.

To compensate for the leakage current, analog compensation circuits are used where replica charge pump legs or branches are implemented to cancel the leakage from PMOS and NMOS devices in the charge pump of a PLL. In these analog compensation techniques, mirrored leakage current is subtracted from the control voltage node, Vctl, where voltage on node Vctl is used to control oscillating frequency of a voltage controlled oscillator of the PLL. However, matching the mirror device is a challenge.

Some analog compensation circuits use leakage current generated by comparing a control voltage node in a charge pump and a charge pump replica. The replica is controlled by a code (e.g., 4 bit digital code). The leakage current is then subtracted from the control voltage node in the charge pump. Since the leakage current is normally less than 1 µA, to detect the voltage difference by such small leakage current, an operational amplifier (Opamp) is designed with almost zero offset, which is difficult and adds to the complexity of a PLL design. In this case, the analog compensation circuit compensates leakage current from a gate and loop filter, and not the leakage in the charge pump. In modern CMOS (complementary metal oxide semiconductor) process technology, charge pump leakage is a big contributor to the total leakage current and cannot be ignored.

The disadvantages of the analog leakage cancellation technique include: (1) it is nearly impossible to cancel leakage for all PVT (process, voltage, and temperature) corners; (2) it is hard to mirror and control leakage current since the magnitude of the leakage current is very small, normally in the order of one-tenth of a micro-ampere or smaller, and (3) the analog compensation devices add additional leakage current themselves.

Some embodiments describe a digital leakage compensation scheme to eliminate the static phase error and reference spur (due to voltage ripples on Vctl, which controls the frequency of a VCO) by cancelling the leakage current using pulse-width-modulation (PWM). In some embodiments, compensation pulses are added to the Up and Down (Dn) inputs of an integral charge pump though OR gates depending on the leakage direction. The number of compensation pulses and pulse width are adjusted digitally according to the static phase error magnitude which is measured by a phase monitor such as a time-to-digital converter (TDC).

Static phase error caused by leakage current is a major concern for analog PLLs when the reference clock frequency is low, such as approximately 19.2 MHz. The digital leakage compensation scheme of various embodiments solves the problem by cancelling the leakage current digitally, and therefore, eliminates the static phase error. The digital leakage compensation technique enables continued use of analog PLLs to meet low power and low jitter requirements. The digital leakage compensation design adds negligible power (e.g., approximately 20 µA) and area (e.g., 34 µm×48 µm) to the whole PLL power and area.

In analog leakage compensation techniques, it is nearly impossible to design a circuit to cancel leakage precisely across PVTs in advanced CMOS technology such as 10 nm and beyond, since the leakage current is normally in the order of sub-micron Amperes, and very sensitive to PVT corners. Also the devices in analog compensation circuits add additional leakage current. In the digital leakage compensation technique of some embodiments, the leakage charge is cancelled precisely by PWM technique (compensation pulse). Since no current mirror is needed to measure leakage current, it is much easier to implement the digital leakage compensation technique, and it saves area, and it does not add additional leakage current because no additional devices are added to the control voltage node, Vctl. Silicon measurement data from a 10 nm test-chip show that, with the digital leakage compensation design feature, the static phase error (at low reference clock frequency of 19.2 MHz) is reduced from, for example, 200 ps (picoseconds) and 750 ps to less than 30 ps, which makes it possible to meet product specification of 50 ps static phase error in certain applications. Other technical effects will be evident from the various embodiments and figures. While the various embodiments are described with reference to a charge pump based PLL, they are also applicable to a charge pump based delay locked loop (DLL).

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device.

The term "between" may be employed in the context of the z-axis, x-axis or y-axis of a device. A device that is between two other devices may be directly connected to one or both of those devices, or it may be separated from both of the other two devices by one or more intervening devices.

Here, the term "backend" generally refers to a section of a die which is opposite of a "frontend" and where an IC (integrated circuit) package couples to IC die bumps. For example, high level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

It is pointed out that those elements of the figures having the same reference numbers (or names) as the elements of any other figure can operate or function in any manner similar to that described, but are not limited to such.

FIG. 1 illustrates a PLL 100 where leakage current in the charge pump causes phase error and drift to control voltage of the oscillator of the PLL. PLL 100 generally consists of a phase detector 101, a charge pump (CP) 102, a low pass filter (LPF) 103, a voltage controlled oscillator (VCO) 104, and divider 105. The phase detector 101 receives a reference clock (RefClk) and a feedback clock (FbClk) and generates Up and Down (Dn) signals that are pulses that represent the relative phase different between the RefClk and the FbClk. Charge pump 102 receives the Up and Dn pulses and sources or sinks current on node V1. The signal on V1 is then filtered by LPF 103 to generate a filtered control voltage Vctl. Vctl is then used to control the oscillating frequency of VCO 104. The output of VCO 104 is VcoClk which is then divided in frequency by Divider 105 to generate FbClk. During PLL lock, Up and Dn signals provide evidence of dynamic phase error. Dynamic phase error is the phase error between RefClk and FbClk before PLL is declared locked. A PLL is declared locked when the phase difference between RefClk and FbClk is below a predetermined threshold.

The dynamic phase error is reduced up to a certain extent by the feedback loop of the PLL. However, after PLL lock, the leakage from the supply node to ground in CP 102 causes drift to control voltage Vctl. This leakage induced drift in Vnctl results in static phase error between RefClk and FBClk. The static phase error limits the performance of the PLL because downstream logic using the PLL output for sampling or other purposes have to account for the phase error uncertainty in their timing margins.

Figure 2:
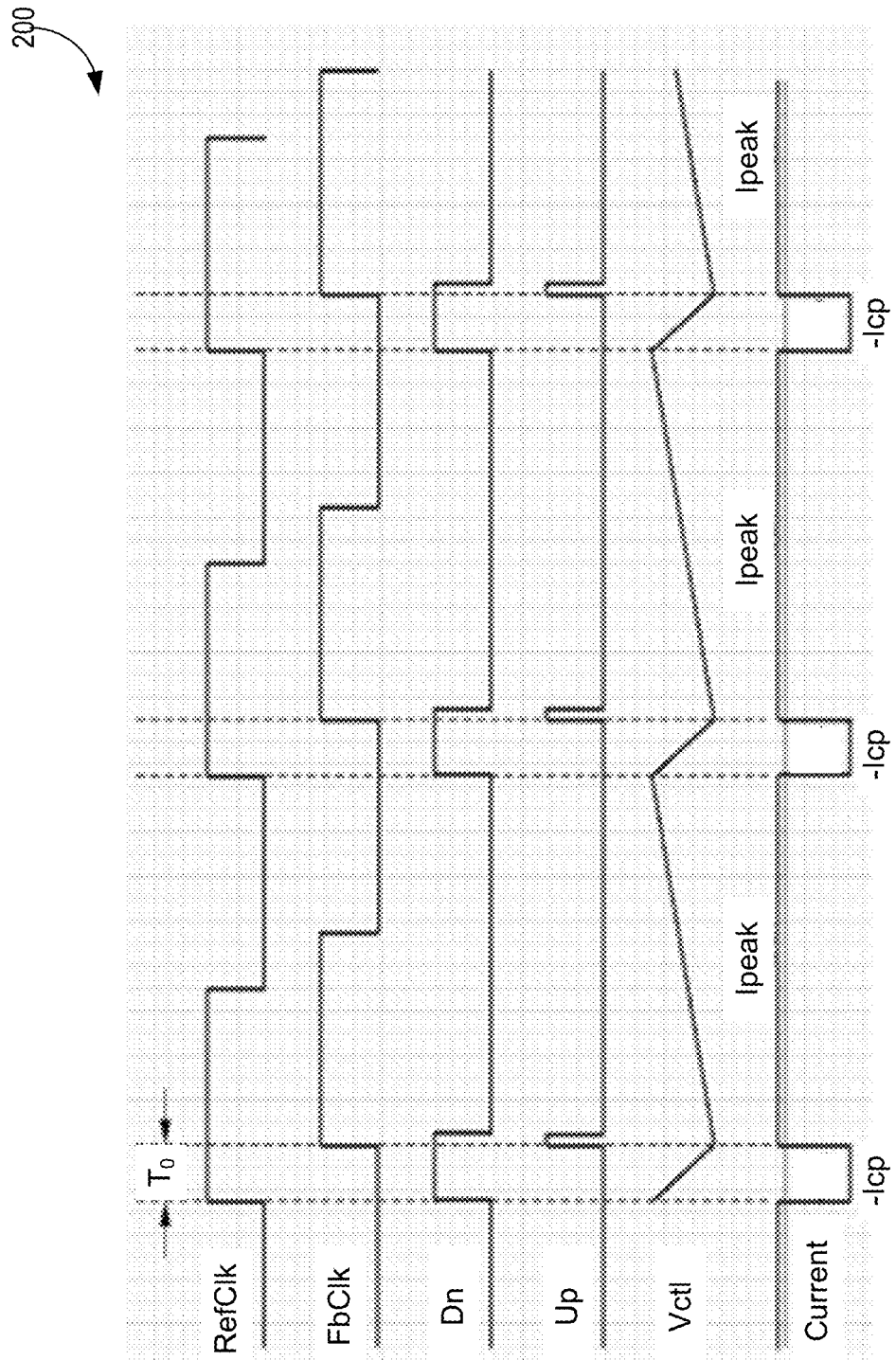
FIG. 2 illustrates a timing diagram of the PLL of FIG. 1 where leakage current in the charge pump causes phase error and drift to control voltage of the oscillator of the PLL.

FIG. 2 illustrates a timing diagram 200 of the PLL of FIG. 1 where leakage current in the charge pump causes phase error and drift to control voltage of the oscillator of the PLL. Timing diagram 200 illustrates FbClk which is delayed relative to a RefClk by a phase difference or error of $T_0$. To neutralize the leakage charge on capacitor C1, Dn pulse is made wider than the residual Up pulse. However, for PLLs with low reference clock frequency (e.g., large multiplication factor N), where the leakage current accumulates for a longer time (reference clock period), the control voltage Vctl to control the VCO can drift higher (if the leakage is from power supply), as shown in FIG. 2.

In this example, during the time between the rising edge of FbClk and the rising edge of RefClk, Vctl drifts higher due to leakage from power supply. This drift is more pronounced when the reference clock is a slow clock. Here, To is the static phase error that remains even in PLL lock condition.

Figure 3:
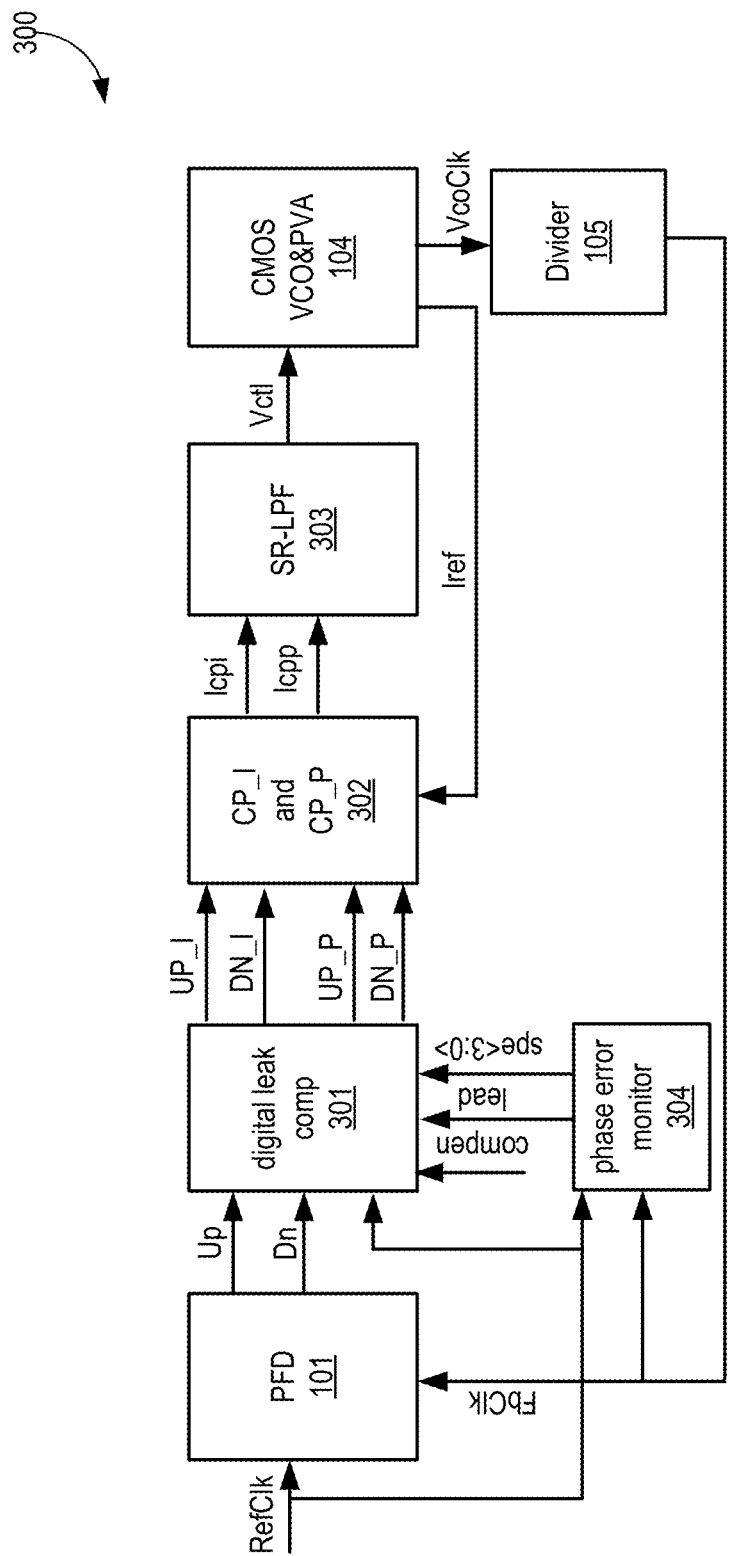
FIG. 3 illustrates a PLL with digital leakage compensation, in accordance with some embodiments.

FIG. 3 illustrates a PLL 300 with digital leakage compensation, in accordance with some embodiments. PLL 300 comprises phase detector 101, digital leakage compensation circuitry 301, integral and proportional charge pumps (CP_I and CP_P) 302, low pass filter 303, VCO and amplifier 104, divider 104, and phase error monitor 304.

In some embodiments, phase detector 101 may be a phase detector only or a phase frequency detector (PFD). Some implementations of phase detector 101 use analogue techniques, while others use digital circuitry. The phase detector 101 can be designed to be sensitive to just phase or sensitive to frequency and to phase. When phase detectors are only sensitive to phase of RefClk and FbClk, they produce an output that is proportional to the phase difference between the two signals. When the phase difference between the RefClk and FbClk is steady, phase detector 101 produces a constant voltage. When there is a frequency difference between the two signals, phase detector 101 produces a varying voltage. Example implementations of phase detectors 101 include diode ring phase detector, exclusive OR phased phase detector, JK flip-flop based comparators, and dual D-type phase detectors. Generally, when a digital phase detector are is to implement phase detector 101, short Up and Dn pulses are created by the logic gates of the digital phase detector. The static phase error is the pulse width difference between Up and Dn pulses, which is caused by leakage current and the charge pump current mismatch.

In some embodiments, digital leakage compensation circuitry 301 eliminates the static phase error by cancelling the leakage current in CP 302 using pulse width modulation (PWM). Since no current mirror circuits are used by the digital leakage compensation circuitry 301 to measure or compensate the leakage current, it is much easier to implement, saves area, and does not add additional leakage current when compared to analog solutions. In some embodiments, digital leakage compensation circuitry 301 receives the Up and Dn signals from phase detector 101 along with RefClk and control signals. The control signals include a digital code (e.g., a 4-bit code spe<3:0>) that represents the phase difference between RefClk and FbCLk. The control signals also include a signal "lead" that indicates whether FbClk is ahead or behind RefClk, with reference to a rising or falling edge of these clocks. In some embodiments, the control signal includes an enable signal "compen" to bypass digital leakage compensation circuitry 301 to allow the PLL to operate in a traditional way with static phase error.

In some embodiments, digital leakage compensation circuitry 301 generates four Up and Dn signals. One pair of Up and Dn signals are Up_I and Dn_I that are used to turn on/off an integral charge pump CP_I (inside charge pump 302). The second pair of Up and Dn signals from digital leakage compensation circuitry 301 are Up_P and Dn_P, which are used to turn on/off a proportional charge pump CP_P (inside charge pump 302). In some embodiments, CP_I is a typical (integral) charge pump used in a PLL and CP_P is the additional (proportional) charge pump.

In some embodiments, voltage pulses (PWM pulses) are generated by digital leakage compensation circuitry 301 and are added to integral charge pump inputs UP_I and Dn_I, generating compensation current pulses $I_{cpi}$ that cancel the leakage charge on the charge pump capacitor C1 (part of LFP 303). In some embodiments, the individual pulse width of the PWM pulses is programmable. For example, propagation delay of delay cells in the digital leakage compensation circuitry 301 can be adjusted to change the compensation range. As such, the pulse width of the PWM pulses are proportional to the static phase error of the PLL before leakage compensation is turned on.

For a given leakage current $I_{leak}$, the static phase error due to leakage after the PLL locks is proportional to the net leakage current, and can be expressed by:

$$T_\theta = (I_{leak}/I_{cpi})T_{ref}$$

where $I_{cpi}$ is the integral charge pump current, and $T_{ref}$ is the reference clock (RefClk) period. Here, current pulse $I_{cpp}$ is the current generated by the proportional CP. When charge pump current or reference clock frequency is low, the static phase error increases, which reduces timing margin in synchronous clock domain crossing in high performance processor design. The digital leakage compensation circuit 301 generates PWM pulses which are proportional to the static phase error and these pulses are used to cancel the leakage.

In some embodiments, the integral charge pump current $I_{cpi}$ and the proportional charge pump current $I_{cpp}$ are converted to voltage Vctl by loop pass filter 303. Vctl is then received by VCO 104. VCO 104 may comprise a ring oscillator with delay stages coupled together to form a ring. The delay stages have adjustable delay, which is controlled by Vctl. By controlling the delay, the frequency of VcoClk is adjusted. The output of VCO 104 is then divided in frequency by Divider 105 (e.g., Johnson Counter). Divider 105 can be an integer divider or a fractional divider.

In some embodiments, phase error monitor 304 comprises a time-to-digital converter (TDC) which converts the static phase error (after lock) between RefClk and FbClk to a digital code (e.g., 4-bit code spe<3:0>), along with a single bit signal "lead" which indicates the relative phase of RefClk and FbClk. In some embodiments, the digital leakage compensation pulse generator 301 generates a PWM pulse that is proportional to the 4-bit digital code and adds the PWM pulse to the UP_I or DN_I pulses, according to the sign (lead=0 or 1) of the static phase error. In some embodiments, the digital leakage compensation pulse generator 301 can be bypassed. For example, when compen is low, UP pulse is provided to Up_I and Up_P, and Dn pulse is provided to Dn_I and Dn_P nodes. In that case, the PLL operates without leakage compensation.

Figure 4:
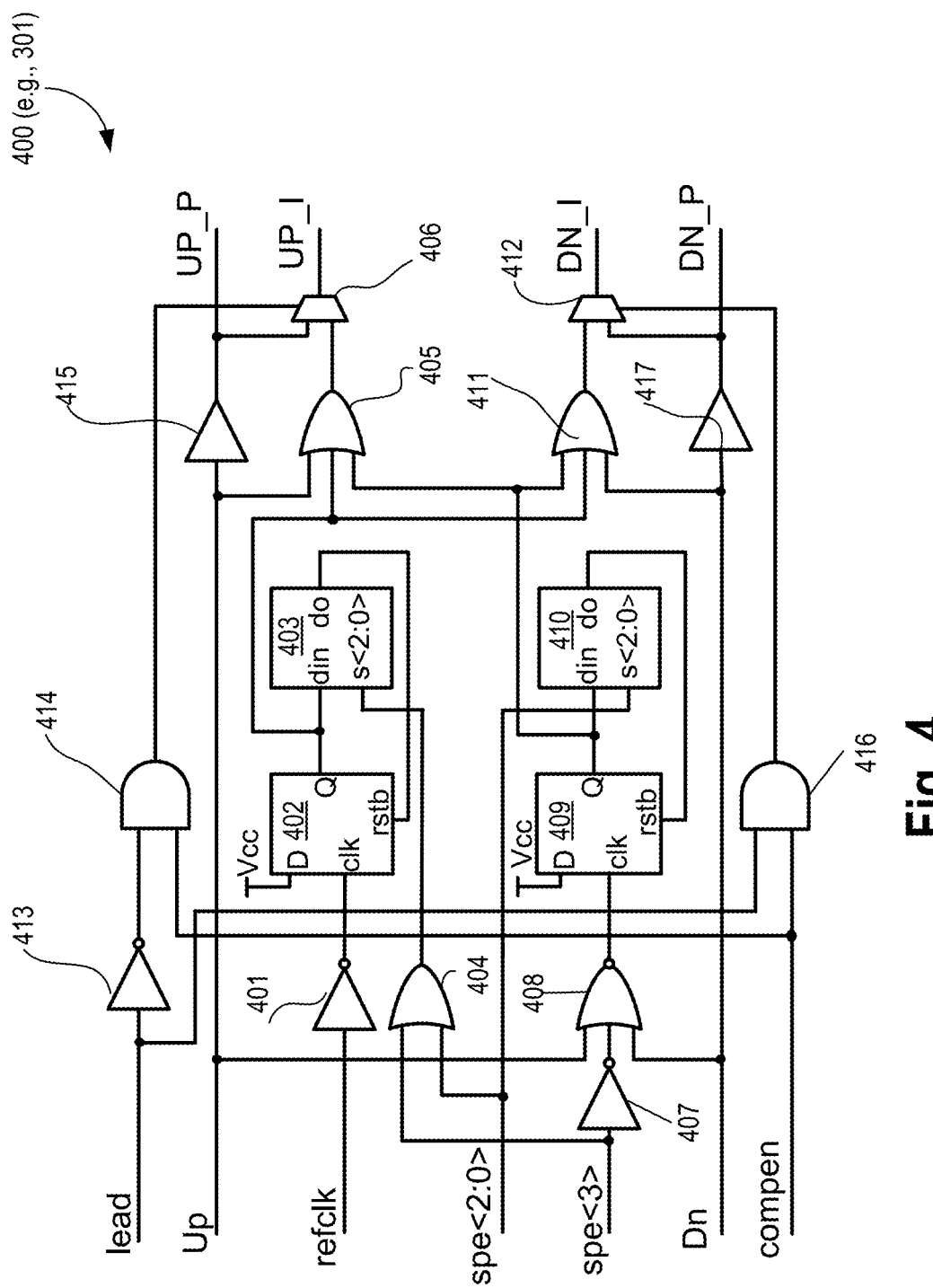
FIG. 4 illustrates a schematic of a digital leakage compensation pulse generator for proportional and integral charge pumps, in accordance with some embodiments.

FIG. 4 illustrates a schematic 400 of a digital leakage compensation pulse generator 301, in accordance with some embodiments. Schematic 400 comprises inverter 401, first resettable flip-flop 402, first programmable delay line 403, OR gate 404, OR gate 405, multiplexer 406, inverter 407, NOR gate 408, second resettable flip-flop 409, second programmable delay line 410, OR gate 411, multiplexer 412, inverter 413, AND gate 414, buffer 415, NAND gate 416, and buffer 417 coupled together as shown. A person skilled in the art can replace various logic gates and logic function using DeMorgan's theorem and achieve the same logic function. Such alternatives are contemplated to be within the scope of the various embodiments. For example, OR gates and AND gates can be replaced with NOR and NAND gates and appropriate logic inversions corrected to achieve the same logic function.

Schematic 400 is used for generating the PWM compensation pulses. These PWM pulses are generated by the output Q of the first and second resettable flip-flops 402 and 409, respectively. The pulse width of the PWM pulses is adjustable by the delay lines 403 and 401.

Here, Up_P and Dn_P pulses are buffered version of Up and Dn pulses from phase detector 101. In some embodiments, one of the pulses (e.g., Up_I) is generated from a falling edge of the RefClk, and another (e.g., Dn_I) is generated from the falling edges of (UP+DN) signals from phase detector 101. In some embodiments, the PWM pulses are generated by first and second resettable flip-flops 402/409 and digitally controlled delay lines 403/410. In some embodiments, the delay of each delay stage of the digitally controlled delay lines 403/410 can be adjusted by, for example, the 3 control bits (spe<2:0>). Other number of bits may also be used for controlling the pulse width. In some embodiments, the $4^{th}$ control bit (e.g., spe<3>) is used to select the number of pulses (e.g., one pulse or two pulses).

For example, when spe<3> is set to logic 1 (or Vcc), two pulses are selected for compensation, and when setting to logic 0 (Vss), one pulse is selected for compensation. In some embodiments, the PWM pulses are added to Up or Dn signals according to the sign of the static phase error, and the modified Up and Dn pulses (e.g., Up_I and Dn_I) are then fed to the integral charge pump and loop filter 303.

Figure 5:
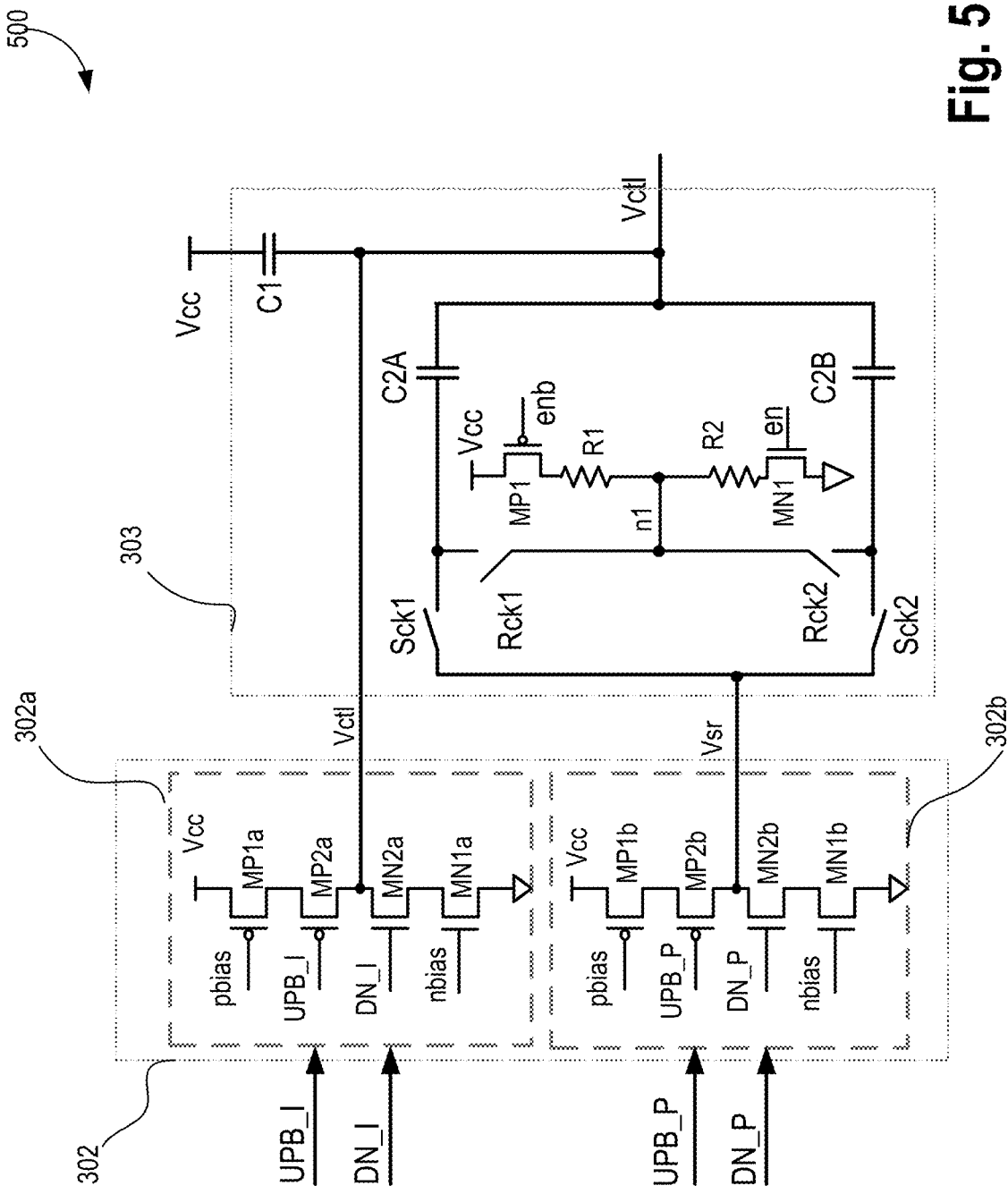
FIG. 5 illustrates a simplified schematic of charge pumps and sample-reset loop filter, in accordance with some embodiments.

FIG. 5 illustrates a simplified schematic 500 of charge pumps and sample-reset loop filter, in accordance with some embodiments. In some embodiments, charge pump 302 comprises an integral charge pump 302a and a proportional charge pump 302b. A simplified version of integral charge pump 302a and proportional charge pump 302b are shown, and other embodiments are also possible. Here, each charge pump has a similar architecture having biased transistors and digitally controlled transistors coupled together in a stack between power supply rail and a ground rail.

In some embodiments, integral charge pump 302a comprises p-type transistors MP1a and MP2a, and n-type transistors MN2a and MN1a coupled in series between supply rail Vcc and ground. Transistor MP1a is controlled by pbias (an analog bias signal) while transistor MN1a is controlled by nbias (an analog bias signal). These bias signals can be generated by any suitable bias circuits. Transistor MP2a is controllable by Upb_I (where Upb_I is an inverse of Up_I) while transistor MN2a is controllable by Dn_1.

In some embodiments, proportional charge pump 302b comprises p-type transistors MP1b and MP2b, and n-type transistors MN2b and MN1b coupled in series between supply rail Vcc and ground. Transistor MP1b is controlled by pbias (an analog bias signal) while transistor MN1b is controlled by nbias (an analog bias signal). Transistor MP2b is controllable by Upb_P (where Upb_P is an inverse of Up_P) while transistor MN2b is controllable by Dn_P.

The loop filter comprises capacitor C1 and a switch capacitor network to provide the resistance. The switched capacitor network comprises four switches controllable by Sck1, Sck2, Rck1, and Rck2. These switches can be implemented as transistors where the control signal is received by the gate of those transistors. Other devices of the switch capacitor network include enable transistors MP1 and MN1 coupled to resistive devices R1 and R2, respectively, and capacitors C2A and C2B. Resistors R1 and R2 are coupled to node n1 which is coupled to the switch capacitor network. In some embodiments, to disable the PLL, transistors MP1 and MN1 are turned off. During normal operation of the PLL, transistors MP1 and MN1 are enabled (e.g., turned on) using enb and en signals.

The capacitors and/or resistors can be implemented with any suitable means. For example, the capacitors C1, C2A, and/or C2B may be implemented as metal capacitors, hybrid capacitors comprising transistor based capacitors and metal capacitors, metal-insulator-metal (MIM) capacitors, or ferroelectric based capacitors. These capacitors can be positioned in the frontend or the backend of the die. In some embodiments, the resistors R1 and R2 can be implemented as transistors or resistors offered by the particular process node.

The capacitors and/or resistors can be implemented with any suitable means. For example, the capacitors C1, C2A, and/or C2B may be implemented as metal-insulator-metal capacitors. In some embodiments, the resistors R1 and R2 can be implemented as transistors or resistors offered by the particular process node.

The switch-resistor (SR) LPF 303 comprises a switched capacitor loop filter circuit. Integral charge pump 302a provides the integral signal part of the control voltage Vctl, and proportional charge pump 302b provides the proportional part. In each reference clock cycle, CP_I 302a charges loop capacitor C1 for a time equal to the phase difference between the reference clock and the feedback clock, while CP_P 302b charges capacitors C1 through C2A and C2B alternatively for the same amount of time. In some embodiments, the four clock phases, Sck1, Sck1, Sck2, and Sck2, which are at half the frequency of the reference clock, are arranged such that in reference clock cycle N, capacitor C2A is charged while capacitor C2B is reset (e.g., the capacitance charge stored on C2B is set) to Vcc/2, and in reference clock cycle N+1, capacitor C2B is charged while capacitor C2A is reset.

Figures 6A, 6B:
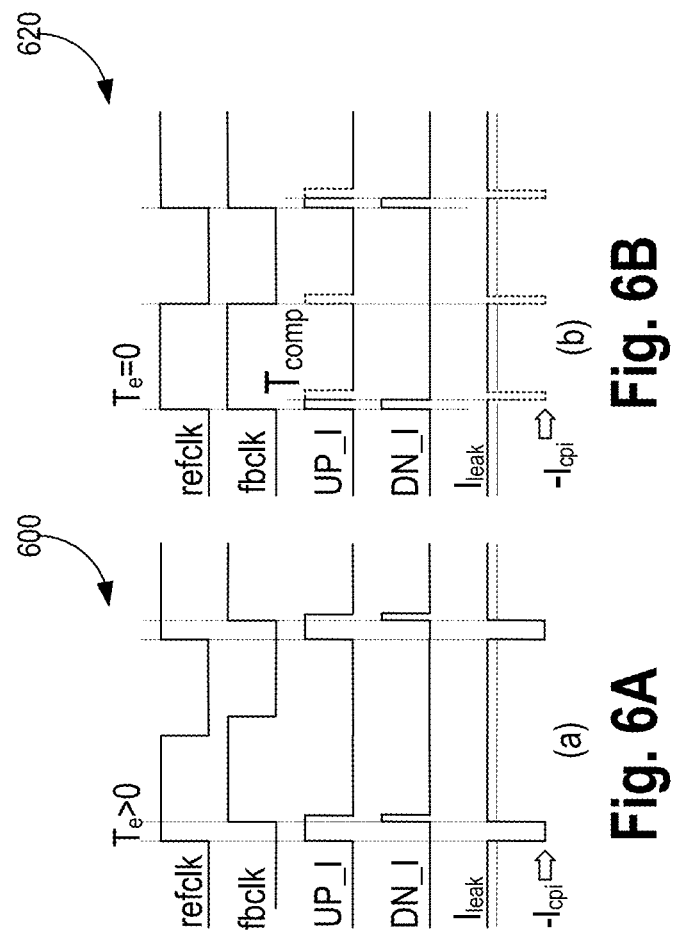
FIGS. 6A-B illustrate timing diagrams showing static phase error due to leakage current from supply node, and adding of compensation pulses to cancel the leakage current, in accordance with some embodiments.

Here, leakage current is assumed to be from supply rail Vcc to control node Vctl, which results in lower VCO frequency and a lagging feedback clock in the absence of the digital leakage compensation circuitry 301 as illustrated by plot 600 of FIG. 6A. Leakage is cancelled by two PWM pulses added to Dn_I. The Dn_I pulses turns on the pull-down legs of the integral charge pump 302a for an additional time period that is equal to the measured static phase error (by phase error monitor 304) before compensation is turned on. As such, the leakage charge is neutralized, and the RefClk and FbClks are aligned as shown by plot 620 of FIG. 6B.

Figure 7:
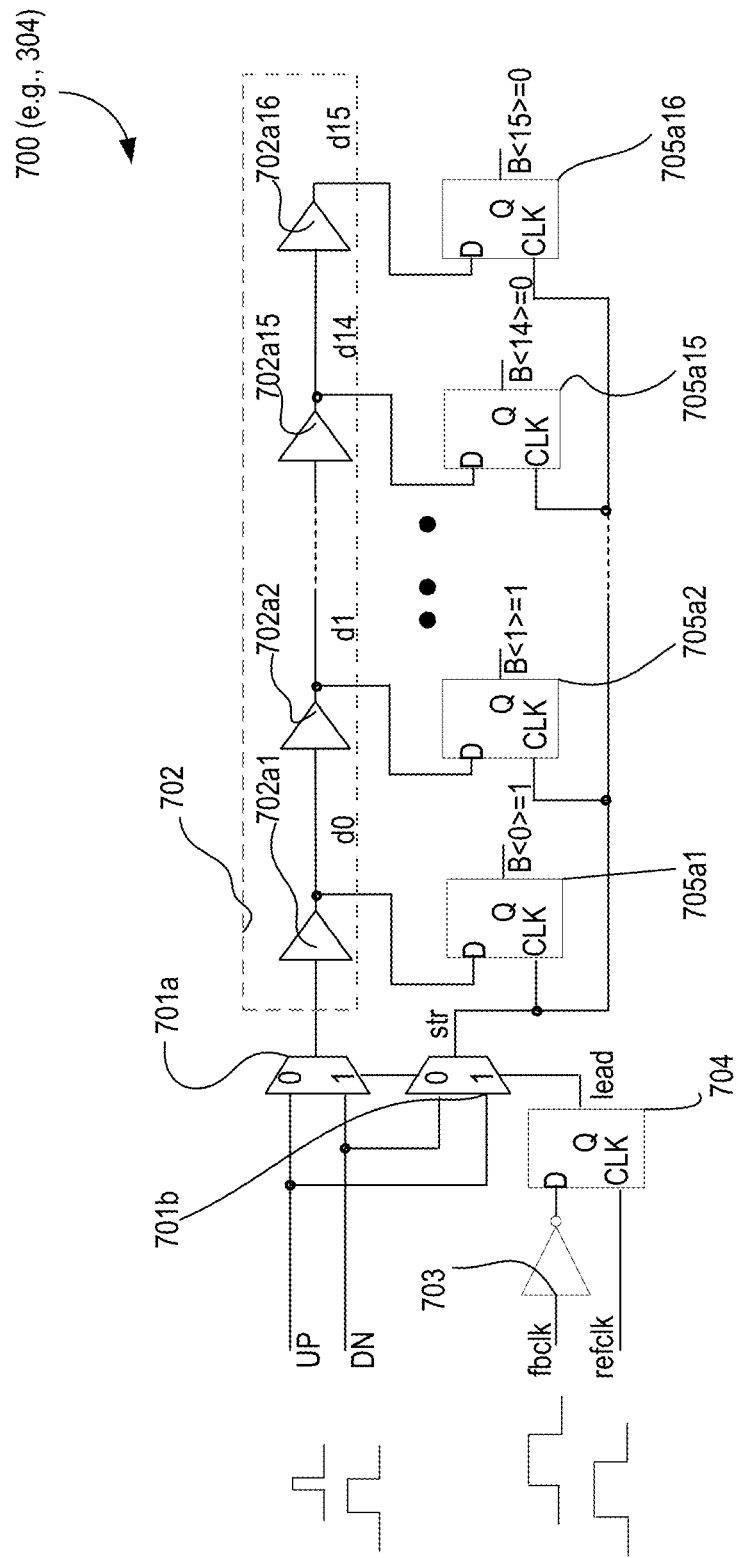
FIG. 7 illustrates a simplified schematic for static phase error monitor, in accordance with some embodiments.

FIG. 7 illustrates a simplified schematic 700 for static phase error monitor, in accordance with some embodiments. The static phase error monitor in implemented as a TDC which comprises multiplexers 701a, 701b, delay line 702 (e.g., having 16 delay cells 702a1, 702a2, . . . 702a15, and 703a16); inverter 703, flip-flop 704, flip-flops (e.g., 16 flip-flops 705a1, 705a2, . . . 705a15, and 705a16). Here, four control bits (spe<3:0>) are generated by the TDC. In some embodiments, each delay stage of the delay line 702 is the same as the one used in the compensation pulse generator (digital leakage compensation circuitry) 301, and the delay can be adjusted digitally. For example, delay stage 702a1 is the same kind which is adjustable delay lines 403 and 410. In the case where reference clock is leading (e.g., lead=1), Dn is passed through the 16 delay stages of delay line 702 and each delayed version is sampled with the Up signal to generate 16 bit thermometer code which reflects the magnitude of the static phase error. In some embodiments, the 16 bit thermometer codes are converted to 4-bit binary code by a converter (not shown). While the embodiment here uses 16 delay stages, any number of delay stages and flip-flops can be used to translate the static phase error into a digital code. The number of delay stages and flip-flops change the resolution of the digital code. For higher resolution, more number of delay stages and flip-flops can be used.

Figure 8:
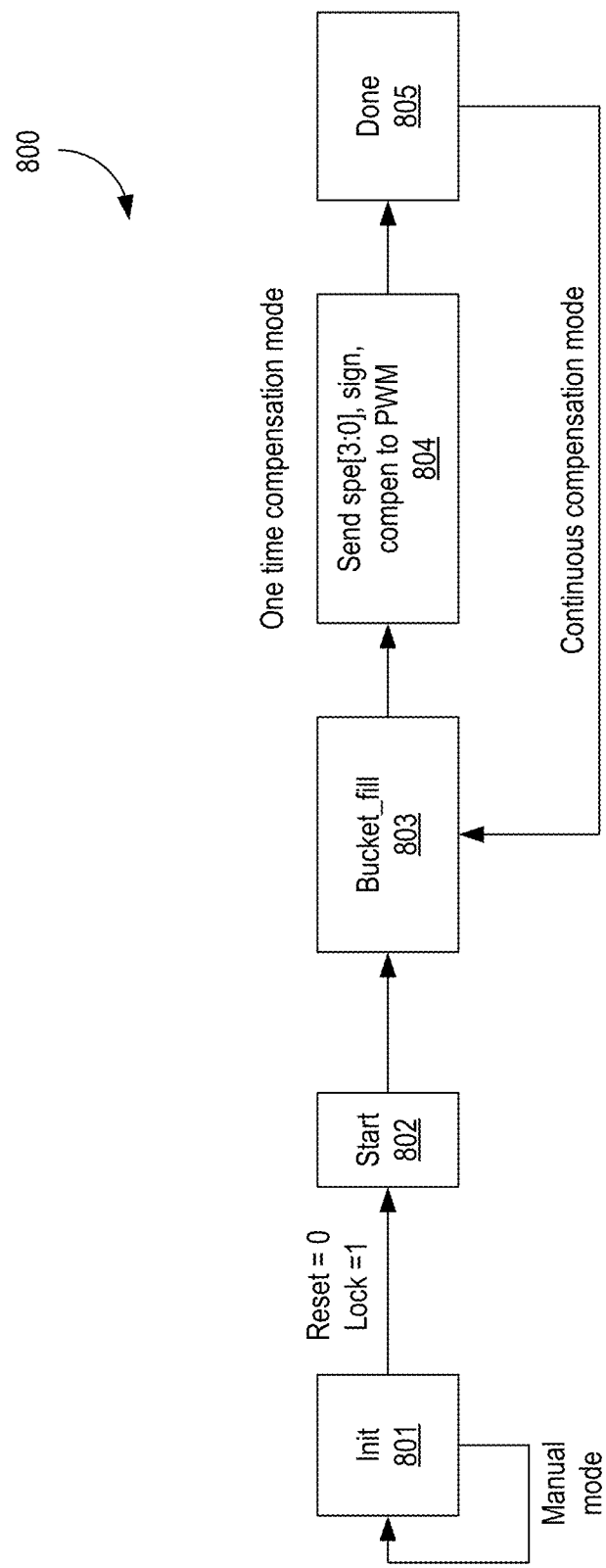
FIG. 8 illustrates a flowchart of a method to compensate leakage effects through digital means, in accordance with some embodiments.

FIG. 8 illustrates flowchart 800 of a method to compensate leakage effects through digital means, in accordance with some embodiments. At block 801, PLL is wakened and initialized. PLL then begins to lock and eventually locks as the dynamic phase error is reduced. At block 802, the process of compensating for leakage begins. To find the static phase error, or average phase error, the phase error measurements are performed in many reference cycles, for example, 128 cycles. At block 803, the output of these phase error measurement (e.g., 16 bits) are accumulated in a counter (e.g., a 16-bit counter). In this example, the bit corresponding to the maximum accumulation represents the magnitude of the static phase error, and the accumulated phase error measurement is converted to a binary code (e.g., 4-bit binary code).

There are two modes in the digital leakage compensation scheme: one-time compensation (as indicated by block 804) and periodic compensation (e.g., as indicated by the loop from blocks 802, 804, 805, and back to 803). Here, one-time compensation means that the compensation is performed only once after the PLL is locked. In this case, the process ends at block 805 and there is no feedback process to reevaluate the static phase error. In the periodic compensation mode, the static phase error is periodically checked and leakage compensation is regularly performed. For example, for an application where static phase error is desired to be kept at close to zero across a wide temperature range, the digital code (e.g., spe[3:0]) is adjusted with temperature since the leakage (and therefore, phase error) is a function of temperature. In this case, the static phase error is measured periodically by circuitry 304 so that leakage current can be compensated at any given temperature. Since the temperature change is very slow, the phase error calibration can be performed every certain time, e.g., 0.1 ms to approximately 1 ms. As such, phase error can be measured periodically to ensure leakage is cancelled at all temperatures.

In one simulation example, with the digital leakage compensation, the static phase error of 700 ps is reduced to almost zero. With the digital leakage compensation, the peak-to-peak voltage ripple in Vctl is also reduced by approximately 10×.

Figure 9:
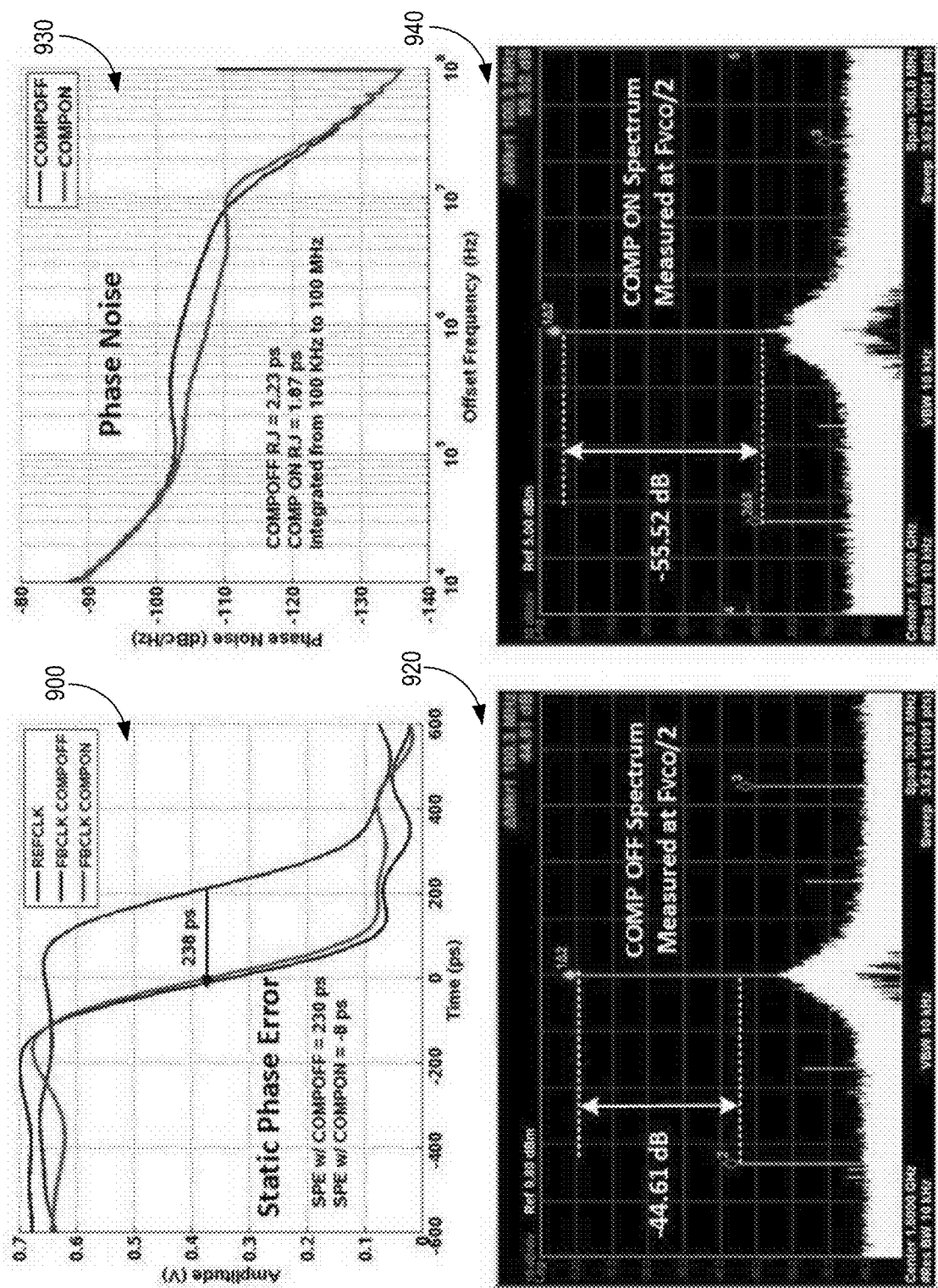
FIG. 9 illustrates a set of plots showing measured static phase error, phase noise, reference spur with and without leakage compensation at 3.2 GHz with 100 MHz reference clock, in accordance with some embodiments.
Figure 10:
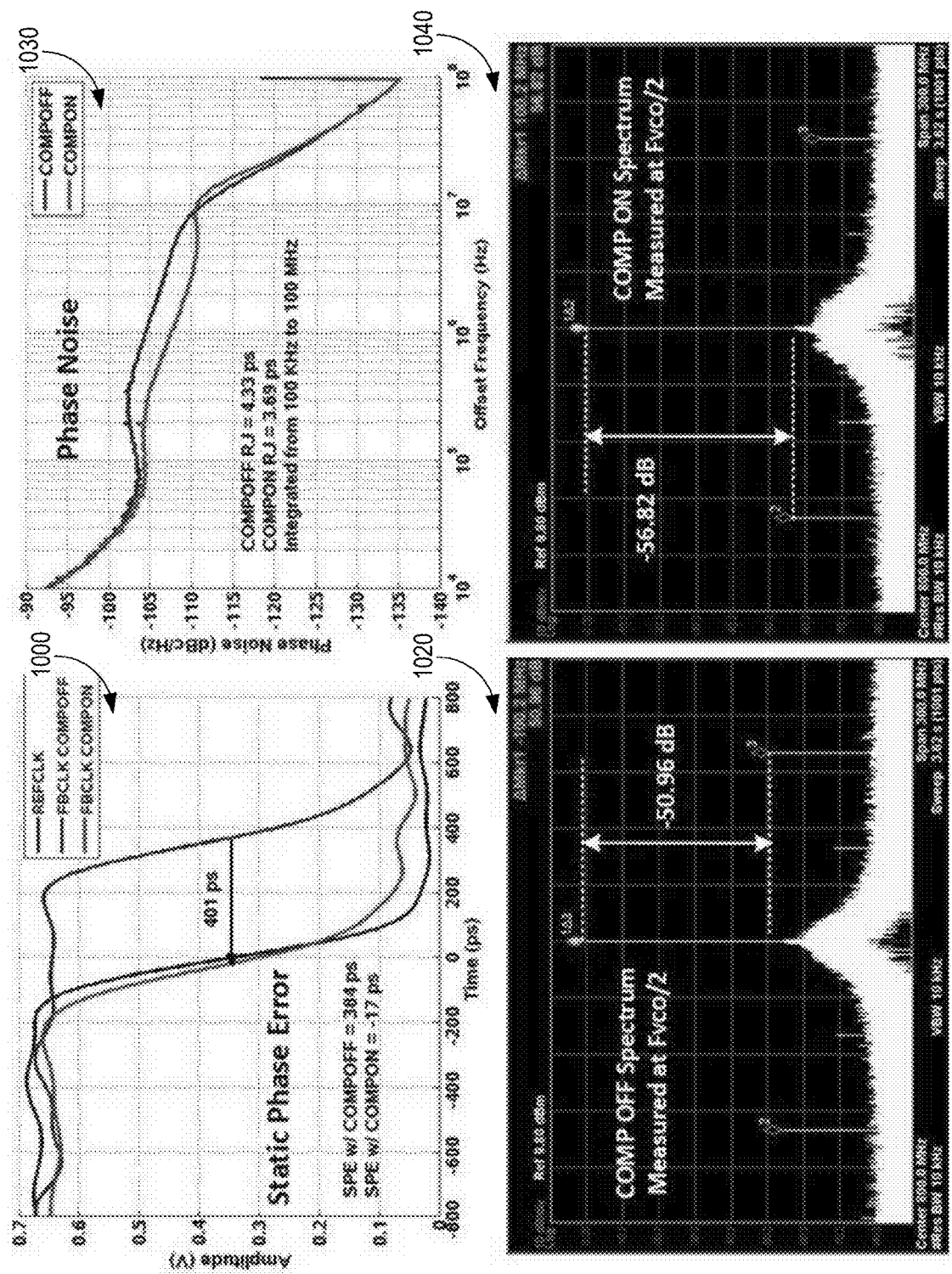
FIG. 10 illustrates a set of plots showing measured static phase error, phase noise, reference spur with and without leakage compensation at 1.6 GHz with 100 MHz reference clock, in accordance with some embodiments.
Figure 11:
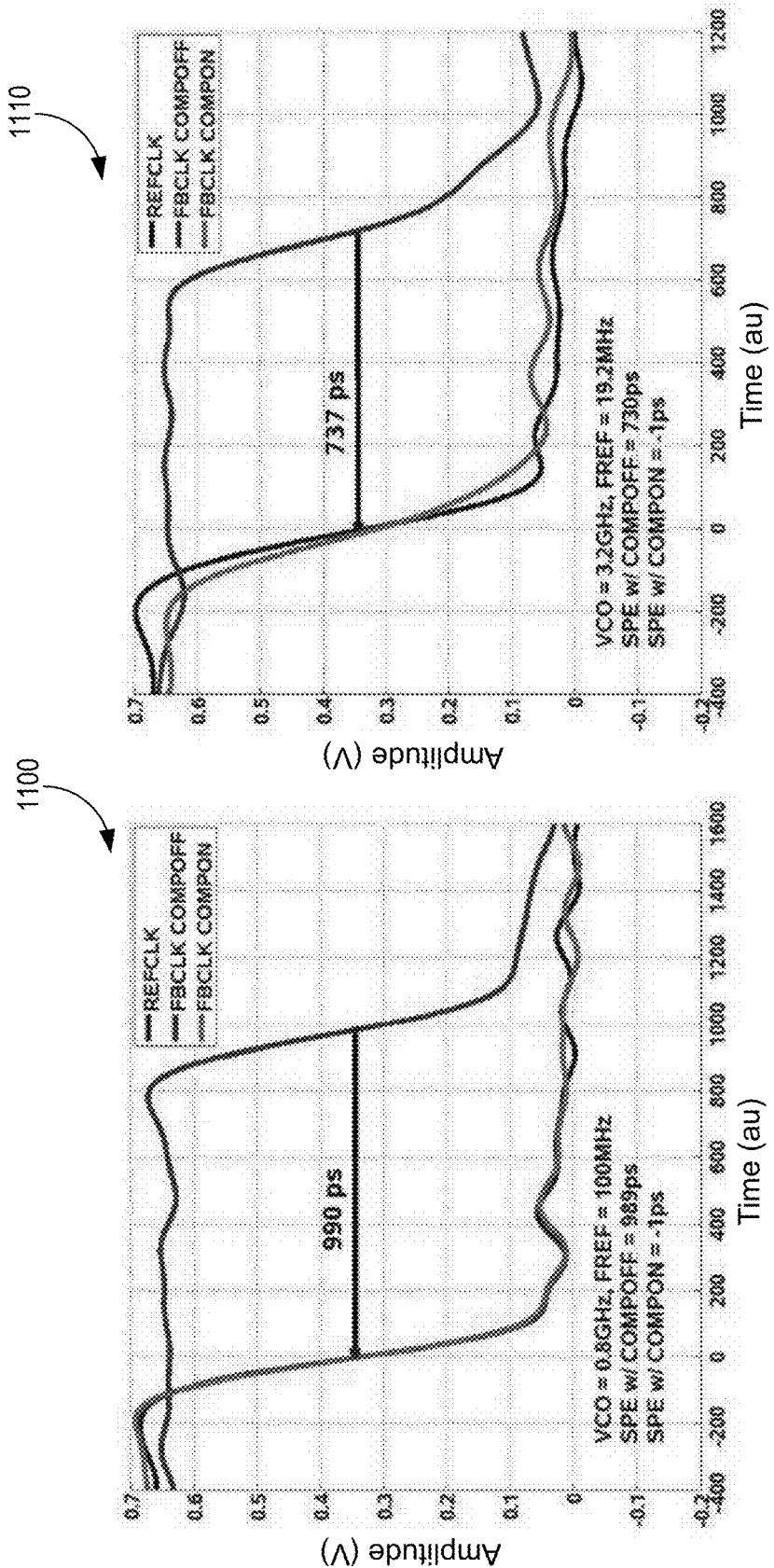
FIG. 11 illustrates a set of plots showing static phase error reduction with digital leakage compensation at low oscillator frequency, low charge pump current, and low reference clock frequency, in accordance with some embodiments.

FIGS. 9-11 illustrate the technical effects of the digital leakage compensation scheme of the various embodiments.

FIG. 9 illustrates a set of plots 900, 920, 930, and 940 showing measured static phase error, phase noise, reference spur with and without leakage compensation at 3.2 GHz with 100 MHz reference clock, in accordance with some embodiments. The plots show a reduction of static phase error from 230 ps to approximately 8 ps. The integrated jitter is reduced from 2.23 ps to 1.87 ps, and reference spur is reduced from −44.61 dB to −55.52 dB when operating at 3.2 GHz with 100 Mhz reference clock and 1.39 mW power consumption at 0.9 V supply.

FIG. 10 illustrates a set of plots 1000, 1020, 1030, and 1040 showing measured static phase error, phase noise, reference spur with and without leakage compensation at 1.6 GHz with 100 MHz reference clock, in accordance with some embodiments. When operating at 1.6 Ghz with 100 MHz reference clock, the static phase error is reduced from 384 ps to 17 ps, the integrated jitter is reduced from 4.33 ps to 3.69 ps, and the reference spur is reduced from −50.96 dB to −56.82 dB. The power consumption in this case is 0.59 mW at 0.9V supply.

FIG. 11 illustrates a set of plots 1100 and 1110 showing static phase error reduction with digital leakage compensation at low oscillator frequency, low charge pump current, and low reference clock frequency, in accordance with some embodiments. The plots show that the static phase error can be corrected to almost 0 with low VCO frequency 0.8 GHz (low charge pump current) and also with low reference clock frequency 19.2 MHz.

Figure 12:
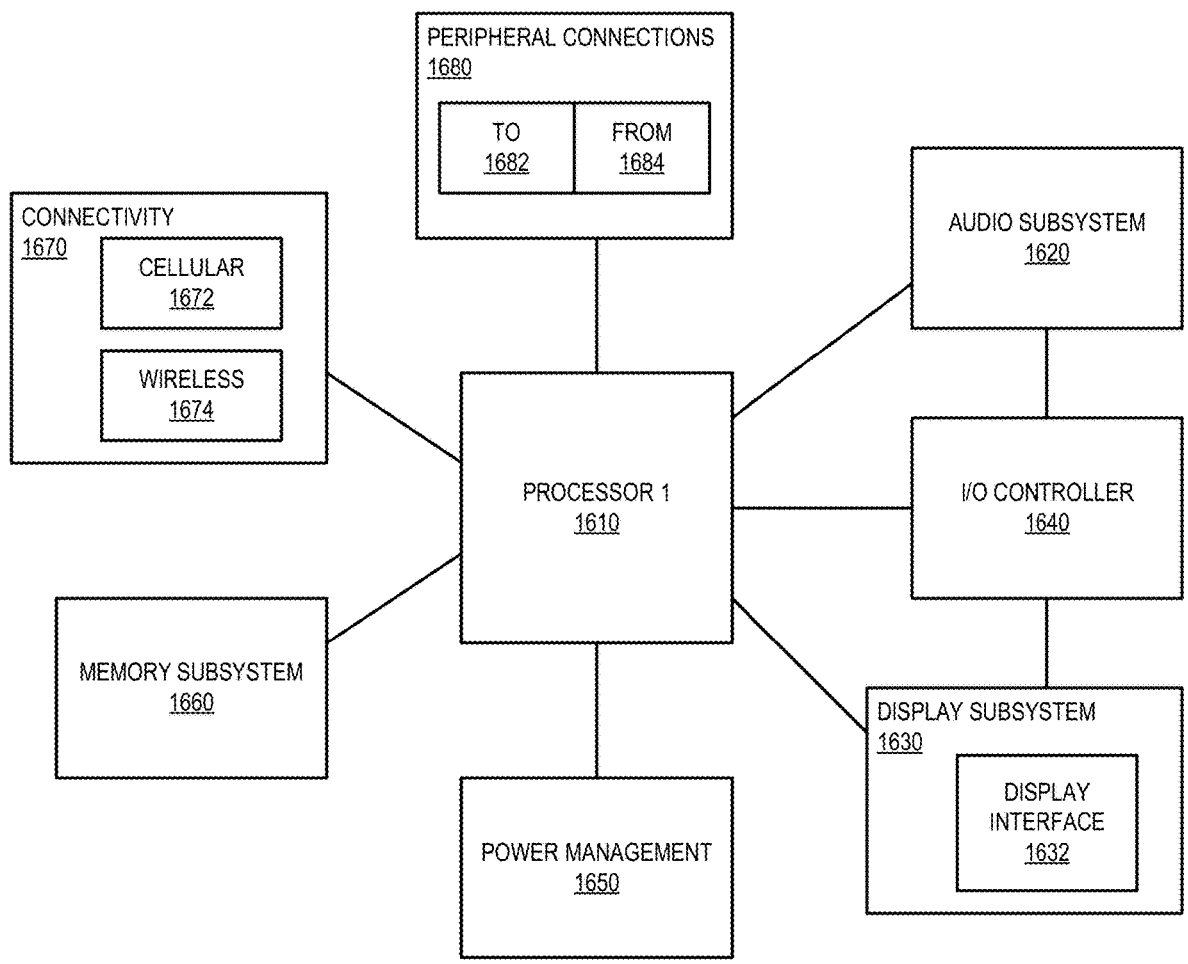
FIG. 12 illustrates a smart device or a computer system or a SoC (System-on-Chip) with a PLL or DLL having digital leakage compensation circuitry, according to some embodiments of the disclosure.

FIG. 12 illustrates a smart device or a computer system or a SoC (System-on-Chip) 1600 with a PLL or DLL having digital leakage compensation circuitry, according to some embodiments of the disclosure. FIG. 12 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 with a PLL or DLL having digital leakage compensation circuitry, according to some embodiments discussed. Other blocks of the computing device 1600 may also include a PLL or DLL having digital leakage compensation circuitry, according to some embodiments.

The various embodiments of the present disclosure may also comprise a network interface within 1670 such as a wireless interface so that a system embodiment may be incorporated into a wireless device, for example, cell phone or personal digital assistant.

In some embodiments, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided to illustrate the various embodiments. These examples can depend from one another in any suitable manner.

Example 1

An apparatus comprising: a circuitry to generate a pulse with a digitally controlled pulse width, wherein the pulse width is proportional to a static phase error of a phase locked loop (PLL) or a delay locked loop (DLL); and a charge pump coupled to the circuitry, wherein the charge pump is to receive the pulse and to source or sink current to or from a node according to the pulse width.

Example 2

The apparatus of example 1 comprising a time-to-digital converter to receive a reference clock and a feedback clock and to generate a bit code representing the static phase error, wherein the circuitry is to receive the bit code or a version of the bit code.

Example 3

The apparatus of example 2, wherein the time-to-digital converter is to generate the bit code after the PLL or DLL is locked.

Example 4

The apparatus of example 2 comprising a phase detector to receive the reference clock and the feedback clock, wherein the phase detector is to generate one or more signals indicating a dynamic phase error between the reference clock and the feedback clock.

Example 5

The apparatus of example 4, wherein the pulse is a first pulse, wherein the circuitry is to generate a second pulse from falling edges of the one or more signal, and wherein the first pulse is generated from the falling edge of the reference clock.

Example 6

The apparatus of example 4, wherein the charge pump is a first charge pump, wherein the node is a first node, wherein the apparatus comprises a second charge pump to receive the one or more signals, and to source or sink current to or from a second node in accordance with a pulse width of the one or more signals.

Example 7

The apparatus of example 1, wherein the bit code is a thermometer code, wherein the apparatus comprises a thermometer-to-binary converter to convert the bit code to the version of the bit code, wherein the version of the bit code is a binary code.

Example 8

The apparatus of example 1, wherein the circuitry includes logic to bypass the pulse.

Example 9

The apparatus of example 1, wherein the circuitry includes a delay line to adjust the pulse width according to a digital control.

Example 10

An apparatus comprising: a first circuitry to receive a reference clock and a feedback clock, wherein the first circuitry is to generate first and second signals representing dynamic phase error of a phase locked loop (PLL) or a delay locked loop (DLL); and a second circuitry to receive the reference clock and the feedback clock and to generate a bit code representing a static phase error of the PLL or DLL.

Example 11

The apparatus of example 10 comprising a third circuitry to generate a first pulse with a digitally controlled first pulse width, wherein the first pulse width is proportional to a static phase error of the PLL or the DLL.

Example 12

The apparatus of example 11, wherein the third circuitry is to generate a second pulse with a digitally controlled second pulse width, wherein the second pulse width is proportional to the static phase error of the PLL or the DLL, wherein the first pulse represents a first static phase error when reference clock leads the feedback clock, and wherein the second pulse represents a second static phase error when the reference clock lags the feedback clock.

Example 13

The apparatus of example 12 comprising a fourth circuitry coupled to the third circuitry, wherein the fourth circuitry is to receive the first and second pulses and to source or sink current to or from a first node according to the first or second pulse widths.

Example 14

The apparatus of example 12 comprising a fifth circuitry coupled to the first circuitry, wherein the fifth circuitry is to receive the Up and Down signals and to source or sink current to or from a second node according to the first and second signals.

Example 15

The apparatus of example 13 comprising a low pass filter coupled to the fourth circuitry.

Example 16

The apparatus of example 15 comprising a voltage controlled oscillator coupled to the low pass filter.

Example 17

The apparatus of example 15 comprising a voltage controlled delay line coupled to the low pass filter.

Example 18

A system comprising: a memory; a processor coupled to the memory, wherein the processor includes a phase locked loop (PLL) or a delay locked loop (DLL), wherein the PLL or DLL comprises: a circuitry to generate a pulse with a digitally controlled pulse width, wherein the pulse width is proportional to a static phase error of a phase locked loop (PLL) or a delay locked loop (DLL); and a charge pump coupled to the circuitry, wherein the charge pump is to receive the pulse and to source or sink current to or from a node according to the pulse width; and an antenna to allow the processor to communicate with another device.

Example 19

The system of example 18 comprising: a time-to-digital converter to receive a reference clock and a feedback clock and to generate a bit code representative of the static phase error, wherein the circuitry is to receive the bit code or a version of the bit code, wherein the time-to-digital converter is to generate the bit code after the PLL or DLL is locked; and a phase detector to receive the reference clock and the feedback clock, wherein the phase detector is to generate one or more signals indicating a dynamic phase error between the reference clock and the feedback clock.

Example 20

The system of example 19, wherein the pulse is a first pulse, wherein the circuitry is to generate a second pulse from falling edges of the one or more signal, and wherein the first pulse is generated from the falling edge of the reference clock.

Example 21

The system of example 20, wherein the charge pump is a first charge pump, wherein the node is a first node, wherein the apparatus comprises a second charge pump to receive the one or more signals, and to source or sink current to or from a second node according to a pulse width of the one or more signals.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
    a circuitry to generate a pulse with a digitally controlled pulse width, wherein the pulse width is proportional to a static phase error of a phase locked loop (PLL) or a delay locked loop (DLL); and
    a charge pump coupled to the circuitry, wherein the charge pump is to receive the pulse and to source or sink current to or from a node according to the pulse width; and
    a time-to-digital converter to receive a reference clock and a feedback clock and to generate a bit code representing the static phase error, wherein the circuitry is to receive the bit code or a version of the bit code.

2. The apparatus of claim 1, wherein the time-to-digital converter is to generate the bit code after the PLL or DLL is locked.

3. The apparatus of claim 1 comprising a phase detector to receive the reference clock and the feedback clock, wherein the phase detector is to generate one or more signals indicating a dynamic phase error between the reference clock and the feedback clock.

4. The apparatus of claim 3, wherein the pulse is a first pulse, wherein the circuitry is to generate a second pulse from falling edges of the one or more signal, and wherein the first pulse is generated from the falling edge of the reference clock.

5. The apparatus of claim 3, wherein the charge pump is a first charge pump, wherein the node is a first node, wherein the apparatus comprises a second charge pump to receive the one or more signals, and to source or sink current to or from a second node in accordance with a pulse width of the one or more signals.

6. The apparatus of claim 1, wherein the bit code is a thermometer code, wherein the apparatus comprises a thermometer-to-binary converter to convert the bit code to the version of the bit code, and wherein the version of the bit code is a binary code.

7. The apparatus of claim 1, wherein the circuitry includes logic to bypass the pulse.

8. The apparatus of claim 1, wherein the circuitry includes a delay line to adjust the pulse width according to a digital control.

9. An apparatus comprising:
a first circuitry to receive a reference clock and a feedback clock, wherein the first circuitry is to generate first and second signals representing dynamic phase error of a phase locked loop (PLL) or a delay locked loop (DLL);
a second circuitry to receive the reference clock and the feedback clock and to generate a bit code representing a static phase error of the PLL or DLL; and
a third circuitry to generate a first pulse with a digitally controlled first pulse width, wherein the first pulse width is proportional to a static phase error of the PLL or the DLL, wherein the third circuitry is to generate a second pulse with a digitally controlled second pulse width, wherein the second pulse width is proportional to the static phase error of the PLL or the DLL, wherein the first pulse represents a first static phase error when reference clock leads the feedback clock, and wherein the second pulse represents a second static phase error when the reference clock lags the feedback clock.

10. The apparatus of claim 9 comprising a fourth circuitry coupled to the third circuitry, wherein the fourth circuitry is to receive the first and second pulses and to source or sink current to or from a first node according to the first or second pulse widths.

11. The apparatus of claim 9 comprising a fourth circuitry coupled to the first circuitry, wherein the fourth circuitry is to receive the Up and Down signals and to source or sink current to or from a second node according to the first and second signals.

12. The apparatus of claim 10 comprising a low pass filter coupled to the fourth circuitry.

13. The apparatus of claim 12 comprising a voltage controlled oscillator coupled to the low pass filter.

14. The apparatus of claim 12 comprising a voltage controlled delay line coupled to the low pass filter.

15. A system comprising:
a memory;
a processor coupled to the memory, wherein the processor includes a phase locked loop (PLL) or a delay locked loop (DLL), wherein the PLL or DLL comprises:
a circuitry to generate a pulse with a digitally controlled pulse width, wherein the pulse width is proportional to a static phase error of a phase locked loop (PLL) or a delay locked loop (DLL); and
a charge pump coupled to the circuitry, wherein the charge pump is to receive the pulse and to source or sink current to or from a node according to the pulse width; and
a time-to-digital converter to receive a reference clock and a feedback clock and to generate a bit code representative of the static phase error, wherein the circuitry is to receive the bit code or a version of the bit code, and wherein the time-to-digital converter is to generate the bit code after the PLL or DLL is locked; and
an antenna to allow the processor to communicate with another device.

16. The system of claim 15 comprising:
a phase detector to receive the reference clock and the feedback clock, wherein the phase detector is to generate one or more signals indicating a dynamic phase error between the reference clock and the feedback clock.

17. The system of claim 16, wherein the pulse is a first pulse, wherein the circuitry is to generate a second pulse from falling edges of the one or more signal, and wherein the first pulse is generated from the falling edge of the reference clock.

18. The system of claim 17, wherein the charge pump is a first charge pump, wherein the node is a first node, and wherein the processor comprises a second charge pump to receive the one or more signals, and to source or sink current to or from a second node according to a pulse width of the one or more signals.

\* \* \* \* \*